Figure 1:
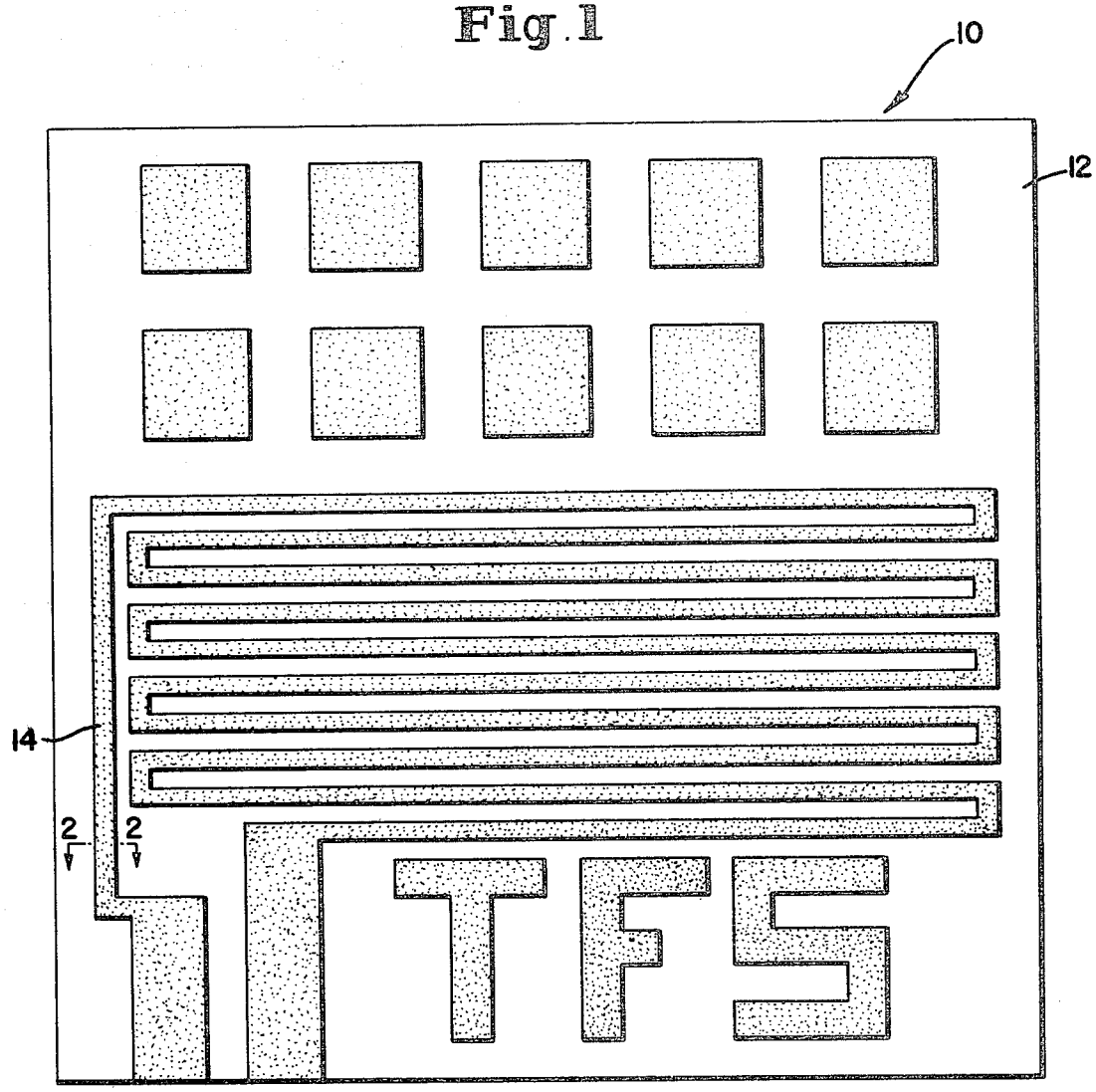

United States Patent [19]

Provance et al.

[11] 4,317,749

[45] Mar. 2, 1982

[54] THICK FILM CONDUCTOR EMPLOYING COBALT OXIDE

[75] Inventors: Jason D. Provance; Kevin W. Allison, both of Santa Barbara, Calif.

[73] Assignee: Ferro Corporation, Cleveland, Ohio

[21] Appl. No.: 180,299

[22] Filed: Aug. 22, 1980

[51] Int. Cl.³ .............................................. H01B 1/06
[52] U.S. Cl. ................................... 252/519; 252/512; 252/513; 106/1.05; 106/1.12; 427/96; 427/126.2; 427/126.6; 428/210; 428/901
[58] Field of Search ....................... 252/512, 513, 519; 428/427, 433, 209, 210, 215, 901, 323, 325, 328; 427/96, 102, 123, 126.1, 126.2, 126.3, 126.6; 106/1.05, 1.12

[56] References Cited

U.S. PATENT DOCUMENTS

| | | | |
|---|---|---|---|
| 3,824,127 | 7/1974 | Conwicke | 252/513 |
| 3,928,242 | 12/1975 | May | 252/513 |
| 3,948,812 | 4/1976 | Conen | 252/518 |
| 4,070,517 | 1/1978 | Kazmierowicz | 252/513 X |
| 4,079,156 | 3/1978 | Youtsey | 427/96 |
| 4,122,232 | 10/1978 | Kuo | 252/513 |

Primary Examiner—Benjamin R. Padgett
Assistant Examiner—J. L. Barr
Attorney, Agent, or Firm—Quaintance & Murphy

[57] ABSTRACT

A thick film conductor, a process for producing such, and a thick film conductor paste, of:
 A. 10 to 30 weight percent boron; and
 B. zero to 35 weight percent glass frit; and
 C. balance essentially cobalt oxide.

19 Claims, 2 Drawing Figures

THICK FILM CONDUCTOR EMPLOYING COBALT OXIDE

BACKGROUND OF THE INVENTION

This invention relates to thick film conductors employing cobalt oxide.

Thick film conductors are well known in the art and are acquiring increasing importance in view of trends in the electronic industry towards smaller and smaller circuits. In the past, thick film conductors have been produced wherein the circuit was of a noble metal. By noble metal is meant gold, silver, palladium, platinum, mixtures thereof and alloys thereof. More recently considerable efforts have been expended in attempting to produce thick film conductors employing base metals such as copper, nickel, and cobalt. Examples of such efforts are described, for example, in:

U.S. Pat. No. 4,070,517 to Kazmierowicz; and
U.S. Pat. No. 4,070,518 to Kazmierowicz; and
U.S. Pat. No. 4,072,771 to Grier; and
U.S. Pat. No. 4,079,156 to Youtsey et al; and
U.S. Pat. No. 4,082,892 to Miller et al; and
U.S. Pat. No. 4,122,232 to Kuo; and
U.S. Pat. No. 4,140,817 to Brown; and
U.S. Pat. No. 4,158,716 to Miller et al; and
U.S. Pat. No. 4,172,919 to Mitchell.

Unfortunately, the prior art suffers from a number of disadvantages. The use of cobalt metal is burdensome because cobalt powder tends to oxidize on storage. The oxidation of cobalt powder on storage gives the cobalt powder an oxide coating which means that the powder is in reality a composition of cobalt metal and cobalt oxide of varying proportions depending upon the degree of oxidation.

Another severe problem of the prior art is the necessity of employing an inert atmosphere such as that of nitrogen or a reducing atmosphere such as that of hydrogen. Nitrogen atmospheres and the special belt furnaces necessary to employ a nitrogen atmosphere are expensive. Hydrogen atmospheres, in addition to being expensive, are potentially explosive and also require special furnaces for their utilization.

It is therefore an object of the present invention to provide an improved thick film conductor paste substantially free of one or more of the disadvantages of prior pastes.

An additional object of the present invention is to provide a process and a thick film conductor paste that can be fired in air.

Another object of the present invention is to provide an improved thick film conductor paste which does not employ a noble metal.

Yet another object of the present invention is to provide an improved thick film conductor paste which does not require the presence of cobalt metal but will tolerate the presence of cobalt metal.

Yet another object of the present invention is to provide a thick film conductor paste that has a long shelf life.

Still another object of the present invention is to provide an improved method for making a thick film conductor.

Still another object of the present invention is to provide an improved thick film conductor.

Figure 2:
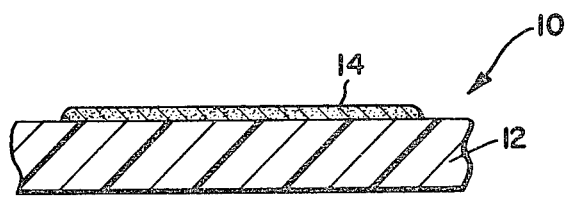

Additional objects and advantages of the present invention will be readily apparent to those skilled in the art by reference to the following detailed description and drawings wherein:

FIG. 1 is a plan view of a thick film conductor 10 of the present invention; and wherein FIG. 2 is an enlarged sectional view taken along Line 2—2 of FIG. 1.

According to the present invention, there is provided a thick film conductor paste of:

A. 10 to 30 and preferably 15 to 25 weight percent boron; and
B. zero to 35 and preferably 5 to 25 weight percent glass frit; and
C. a balance essentially cobalt oxide wherein all weight percentages are on a dry basis.

According to another aspect of the present invention, there is provided a method for making a thick film conductor comprising the steps of:

I. depositing the thick film conductor paste on an electrically non-conductive substrate in the form of a circuit to form a coated substrate; and then
II. heating the coated substrate in air for a time sufficient to cause the paste to adhere to the substrate and to render the paste electrically conductive.

The heating of the coated substrate, which is sometimes referred to as firing, can be accomplished at widely varying temperatures but generally is effected at 500° to 1000° C. However, the amount of boron varies with the heating temperature.

When the heating is effected at 500° to 699° C., the boron must comprise from 17 to 30 weight percent of the paste on a dry basis. Furthermore, within this temperature range of 500° to 699° C., the combined weight of boron and glass frit must be 20 to 30 weight percent of the paste on a dry basis.

When heating is effected at 700° to 1000° C., the boron can amount to 10 to 30 weight percent and preferably amounts to 15 to 25 weight percent on a dry basis.

Referring now to the drawings, and in particular FIGS. 1 and 2, there is shown a thick film conductor 10. The conductor 10 comprises an electrically non-conductive substrate 12 having a circuit 14 thereon. The circuit 14 is produced on the substrate 12 by applying the paste of the present invention in a pattern in the form of the circuit 14 and then heating the paste as described elsewhere herein.

The boron useful in the present invention is preferably particulate. It generally has a particle size of 0.01 to 100 microns and preferably has a particle size of 0.5 to 15 microns. The boron is preferably pure but can contain up to 10 weight percent of the impurities normally associated with boron. The boron can be in any useful form and can either be amorphous or crystalline. At percentages which are much less or are much greater, the paste when fired does not have a desirably low resistivity.

In the broadest aspects of the present invention, glass frit need not be present. However, when present, it comprises no more than 35 weight percent of the conductor paste on a dry basis. When present, it preferably comprises from 5 to 25 weight percent on a dry basis. Any glass frit previously employed in thick film conductor pastes can be employed in the present invention; however, lead borosilicate glasses are preferred. Table I gives the designation of compositions of five different glass frits suitable for use in the present invention. Glass frit Composition B is the preferred composition.

TABLE I

| Oxide | Designation of Composition | | | | |
|---|---|---|---|---|---|
| | A | B | C | D | E |
| $SiO_2$ | 17% | 11% | 7% | 12% | 29% |
| PbO | 69 | 81 | 86 | 9 | 54 |
| $B_2O_3$ | 10 | 4 | 3 | 2.5 | |
| $Al_2O_3$ | 3 | 3 | 3 | | 2 |
| $ZrO_2$ | 1 | 1 | 1 | | |
| $Bi_2O_3$ | | | | 71.5 | 8 |
| CaO | | | | 2 | |
| $WO_3$ | | | | 1 | |
| $Cu_2O$ | | | | 2 | 3 |
| CdO | | | | | 4 |
| Total | 100 | 100 | 100 | 100 | 100 |

The cobalt oxide useful in the present invention is any binary compound of cobalt and oxygen including $Co_2O_3$, $Co_3O_4$ and CoO together with any water of hydration and together with the impurities normally associated with them. The preferred cobalt oxide is cobaltous oxide (CoO) because of cost, availability and reactivity. The cobalt oxide is preferably particulate and generally has a particle size of 0.01 to 100 microns and preferably has a particle size of 0.5 to 15 microns. In accordance with the present invention, cobalt oxide comprises a major portion of the composition as defined elsewhere herein. On the other hand, admixture of cobalt oxide with cobalt metal does not adversely affect the present invention.

Presence of cobalt metal in the thick film conductor pastes of the present invention is not required. However, cobalt metal does not adversely effect the novel and advantageous properties of the thick film conductor paste of the present invention. When cobalt metal is present, it is generally present in a ratio of cobalt oxide to cobalt metal of 100:1 to 0.1:1 and preferably 10:1 to 0.5:1.

As specified herein, all weight percentages are on a dry basis and do not take into consideration the amount of an inert liquid vehicle which is nevertheless commonly present in the paste. The more volatile components of the inert liquid vehicle normally are removed prior to firing by a simple air-drying process. However, the less volatile components of the inert liquid vehicle are removed during the firing process. As used herein, firing means heating to high temperatures as described elsewhere herein. Any inert liquid vehicle heretofore employed can be employed in the present invention. These inert liquid vehicles commonly comprise a solvent, a thickening agent and any number of optional ingredients. Suitable solvents include among others terpinol, pine oil, glycol, esters, alcohols, ketones, and acetone as well as commercially available solvents such as texanol, terpineol, butyl carbitol acetate and the like. Examples of suitable thickening agents include among others ethyl cellulose and nitro cellulose. Examples of optional ingredients include among others perfumes, coloring agents, stabilizers, and other inert ingredients. The inert liquid vehicle is commonly referred to in the art simply as the vehicle. The inert organic vehicle is present in an amount to provide the paste with a viscosity of 500 to 2,000 and preferably 800 to 1200 poise. Viscosity is normally measured by a Brookfield HBT cone and plate viscometer at 2.50 revolutions per minute with a 1.565 cone. The solids present in the paste are normally dispersed in the inert organic vehicle at a level of generally 50 to 90 and preferably 70 to 80 weight percent solids.

Any substrate heretofore employed to produce a thick film conductor can be employed in the present invention. Preferred compositions of substrates include those of glass, ceramic, such as alumina, porcelain-coated steel, silicon and glass-bonded mica.

The depositing of the paste on the substrate can be accomplished by any suitable process which produces a pattern in the form of the desired circuit. Dipping, spraying and painting are suitable. However, the preferred method for depositing the paste on the substrate is to pass the paste through a screen having the desired circuit thereon as a pattern. The screen is placed in contact with the substrate and the paste forced through the mesh opening of the screen as is well known in the art. The method is commonly referred to as screen printing.

The temperature of the heating step is absolutely critical to the process of the present invention. If the heating occurs at temperatures of less than 500° C., the resistivity of the paste is not reduced to an appropriate level. Likewise, at temperatures above 1000° C., the resultant air-fired paste will not have a desirably low resistivity. The heating is conducted for a time sufficient to cause the paste to adhere to the substrate and to render the paste electrically conductive. Heating times can vary widely but are generally more than 90 seconds and less than 60 minutes and are preferably 5 minutes to 20 minutes. Heating times less than 90 seconds are generally insufficient to reduce the resistivity. Heating times longer than 60 minutes generally cause an undesirable increase in resistivity. In fact, a special advantage of the present invention is the ability to use the commonly employed belt furnace having a total heating time of 25 minutes with approximately 10 minutes being at the maximum temperature. The heated residue of the thick film conductor paste generally has a resistivity less than 20 and preferably less than one ohms/square.

The heating can also be effected by infrared radiation.

The invention may be better understood by reference to the following examples wherein all parts and percentages are by weight unless otherwise indicated. The examples are summarized in Table II.

EXAMPLE 1

The following quantities and the following ingredients are combined as indicated:

| Item | Ingredient | Parts by Weight |
|---|---|---|
| A | boron | 20 |
| B | glass frit-Composition B | 10 |
| C | CoO | 70 |

Items A, B and C are mixed in a vessel together with a vehicle which is a mixture of terpineol and ethyl cellulose in a weight ratio of 92:8, in an amount sufficient to give the paste a viscosity of 900 poise.

The paste is screen-printed onto an alumina substrate in the form of a circuit 14 shown in FIG. 1. The coated substrate is heated in air for 25 minutes in a belt furnace. Of the 25 minutes total furnace time, 10 minutes were at 600° C. The resistivity of the film is measured with a multimeter and is found to be 250 ohms per square.

An identically coated substrate is heated in an identical belt furnace except that the heating was effected at 850° C. for 10 minutes. The resistivity is found to be 0.150 ohms/square.

All resistivity readings given herein have been equilibrated to a circuit one mil (0.001 inches) thick.

The results of Example 1 are recorded in Table II wherein Col. 1 gives the example number. Col. 2 gives the weight percent of boron. Col. 3 gives the weight percent of glass frit. Col. 4 gives the sum of the entries in Cols. 2 and 3. Col. 5 gives the weight percent of cobaltous oxide. Cols. 6 and 7 give the resistivity measured in ohms per square when the coated substrate is heated at 600° or at 850° C. respectively.

EXAMPLES 2–10

The procedure of Example 1 is repeated except that the boron is replaced with the amount as disclosed in Col. 2 of Table II. The glass is present in the amount shown in Col. 3 of Table II. The amount of cobaltous oxide is that shown in Col. 5 of Table II. The resistivity is measured and is recorded in Cols. 6 and 7 of Table II.

TABLE II

| 1. Ex. No. | 2. Boron (wt %) | 3. Glass Frit. (wt %) | 4. Combined (wt %) | 5. CoO (wt %) | RESISTIVITY | |
|---|---|---|---|---|---|---|
| | | | | | 6. Heated at 600° C. (ohms/sq) | 7. Heated at 850° C. (ohms/sq) |
| 1 | 20 | 10 | 30 | 70 | 250 | 0.150 |
| 2 | 20 | 5 | 25 | 75 | 35 | 0.125 |
| 3 | 15 | 5 | 20 | 80 | OS | 14 |
| 4 | 15 | 10 | 25 | 75 | 3000 | 0.340 |
| 5 | 20 | 0 | 20 | 80 | 30 | 0.170 |
| 6 | 25 | 0 | 25 | 75 | 480 | 0.160 |
| 7 | 20 | 15 | 35 | 65 | OS | 0.200 |
| 8 | 25 | 5 | 30 | 70 | 180 | 0.240 |
| 9 | 25 | 10 | 35 | 65 | OS | 0.560 |
| 10 | 25 | 15 | 40 | 60 | OS | 0.800 |

In Table II, the notation "OS" in Col. 6 means "off-scale" by which is meant a resistivity greater than $10^7$ ohms/square.

Although the invention has been described in considerable detail in reference to certain preferred embodiments thereof, it will be understood that modifications and variations can be made within the spirit and scope of the invention as described above and as defined in the appended claims.

What is claimed is:

1. A thick film conductor paste of:
A. 10 to 30 weight percent boron; and
B. zero to 35 weight percent glass frit; and
C. balance essentially cobalt oxide,
wherein all weight percentages are on a dry basis.

2. The paste of claim 1 wherein the boron is present in an amount equal to 15 to 25 percent on a dry basis.

3. The paste of claim 1 wherein the boron is particulate.

4. The paste of claim 3 wherein the boron has a particle size of 0.01 to 100 microns.

5. The paste of claim 1 wherein the cobalt oxide is particulate.

6. The paste of claim 5 wherein the cobalt oxide has a particle size of 0.01 to 100 microns.

7. The paste of claim 1 wherein cobalt oxide is CoO.

8. The paste of claim 1 further comprising an inert liquid vehicle present in an amount sufficient to give the paste a viscosity of 500 to 2000 poise.

9. A thick film conductor paste having a long shelf life and being capable of being fired in air to produce a circuit on an electrically non-conductive substrate, said paste consisting essentially of:
A. 15 to 25 weight percent boron; and
B. 5 to 25 weight percent glass frit; and
C. balance essentially CoO
wherein all weight percentages are on a dry basis;
wherein the boron and the CoO are particulate and have a particle size of 0.5 to 15 microns;
wherein the boron, glass frit, and CoO are dispersed in an inert liquid vehicle present in an amount sufficient to give the paste a viscosity of 800 to 1200 poise;
wherein the solids content of the paste is 70 to 90 weight percent.

10. A method of making a thick film conductor comprising the steps of:
I. depositing a thick film conductor paste of:
A. 10 to 30 weight percent boron; and
B. zero to 35 weight percent glass frit; and
C. balance essentially cobalt oxide
on an electrically non-conductive substrate in the form of a circuit to form a coated substrate wherein all weight percentages are on a dry basis; and then
II. heating the coated substrate in air at a temperature of 700° to 1000° C. for a time sufficient to cause the paste to adhere to the substrate and to render the paste electrically conductive.

11. A method of making a thick film conductor comprising the steps of:
I. depositing a thick film conductor paste of:
A. 17 to 30 weight percent boron; and
B. zero to 35 weight percent glass; and
C. balance essentially cobalt oxide wherein the sum of A and B is 20 to 35 weight percent,
on an electrically non-conductive substrate in the form of a circuit to form a coated substrate wherein all weight percentages are on a dry basis; and then
II. heating the coated substrate in air at a temperature of 500° to 699° C. for a time sufficient to cause the paste to adhere to the substrate and to render the paste electrically conductive.

12. The method of claim 10 wherein the heating time is 90 seconds to 60 minutes.

13. The method of claim 11 wherein the heating time is 90 seconds to 60 minutes.

14. The method of claim 10 wherein the substrate is selected from the group consisting of glass, ceramic, alumina, porcelain-coated steel, silicon and glass-bonded mica.

15. The method of claim 11 wherein the substrate is selected from the group consisting of glass, ceramic, alumina, porcelain-coated steel, silicon and glass-bonded mica.

16. The method of claim 10 wherein the air is atmospheric air containing approximately 20.9 weight percent oxygen.

17. The method of claim 11 wherein the air is atmospheric air containing approximately 20.9 weight percent oxygen.

18. A thick film conductor comprising:
I. an electrically non-conductive substrate;
II. an electrically conductive circuit on the substrate which is the heated-in-air product of a thick film conductor paste of:
A. 10 to 30 weight percent boron; and
B. zero to 35 weight percent glass frit; and
C. balance essentially cobalt oxide,
wherein all weight percentages are on a dry basis.

19. The conductor of claim 18 wherein the product of the thick film conductor paste has a resistivity of less than 20 ohms per square.

* * * * *